(12) United States Patent
Miki et al.

(10) Patent No.: US 7,635,824 B2
(45) Date of Patent: Dec. 22, 2009

(54) PLASMA GENERATING ELECTRODE, PLASMA GENERATION DEVICE, AND EXHAUST GAS PURIFYING DEVICE

(75) Inventors: Masanobu Miki, Utsunomiya (JP); Kenji Dosaka, Shiyoa-gun (JP); Yukio Miyairi, Nagoya (JP); Yasumasa Fujioka, Nagoya (JP); Masaaki Masuda, Nagoya (JP); Takeshi Sakuma, Nagoya (JP); Tatsuhiko Hatano, Kasugai (JP)

(73) Assignees: NGK Insulators, Ltd., Nagoyo (JP); Honda Motor Co., Ltd., Tokyo (JP)

( * ) Notice: Subject to any disclaimer, the term of this patent is extended or adjusted under 35 U.S.C. 154(b) by 776 days.

(21) Appl. No.: 10/560,805

(22) PCT Filed: Jun. 18, 2004

(86) PCT No.: PCT/JP2004/008617
§ 371 (c)(1),
(2), (4) Date: Dec. 15, 2005

(87) PCT Pub. No.: WO2004/114728
PCT Pub. Date: Dec. 29, 2004

(65) Prior Publication Data
US 2006/0152163 A1   Jul. 13, 2006

(30) Foreign Application Priority Data
Jun. 20, 2003 (JP) ............... 2003-177232

(51) Int. Cl.
*B23K 10/00* (2006.01)
(52) U.S. Cl. .................. 219/121.52; 315/111.51
(58) Field of Classification Search .......... 219/121.5, 219/121.52, 121.41, 121.43; 118/723 I; 315/111.51
See application file for complete search history.

(56) References Cited

FOREIGN PATENT DOCUMENTS

| JP | A 8-49525 | 2/1996 |
|----|-----------|--------|
| JP | A 9-245993 | 9/1997 |
| JP | A 2001-164925 | 6/2001 |
| JP | A 2001-274103 | 10/2001 |
| JP | A-2002-129947 | 5/2002 |

*Primary Examiner*—Mark H Paschall
(74) *Attorney, Agent, or Firm*—Oliff & Berridge, PLC (57) ABSTRACT

A plasma generating electrode of the invention present includes at least a pair of electrodes 5, at least one electrode 5a of the pair of electrodes 5 including a plate-like ceramic body 2 as a dielectric and a conductive film 3 disposed inside the ceramic plate 2 and having a plurality of through-holes 4 formed through the conductive film 3 in its thickness direction, the through-holes having a cross-sectional shape including an arc shape along a plane perpendicular to the thickness direction. The plasma generating electrode can generate uniform and stable plasma at low power consumption.

8 Claims, 4 Drawing Sheets

PLASMA GENERATING ELECTRODE, PLASMA GENERATION DEVICE, AND EXHAUST GAS PURIFYING DEVICE

TECHNICAL FIELD

The present invention relates to a plasma generating electrode, a plasma generation device, and an exhaust gas purifying device. More particularly, the invention relates to a plasma generating electrode and a plasma generation device capable of generating uniform and stable plasma at low power consumption. The invention also relates to an exhaust gas purifying device capable of purifying exhaust gas well.

BACKGROUND ART

It is known that silent discharge occurs when disposing a dielectric between two electrodes and applying a high alternating current voltage or a periodic pulsed voltage between the electrodes and that, in the resulting plasma field, active species, radicals, and ions are produced to promote reaction and decomposition of gas. This phenomenon may be utilized to remove toxic components contained in engine exhaust gas or incinerator exhaust gas.

For example, a plasma exhaust gas treatment system has been disclosed in which $NO_x$, carbon fine particles, HC, and CO contained in engine exhaust gas or incinerator exhaust gas is oxidized by causing the engine exhaust gas or incinerator exhaust gas to pass through plasma (e.g. JP-A-2001-164925).

DISCLOSURE OF THE INVENTION

However, since such a plasma generating electrode used to generate plasma causes a local point discharge to occur between a pair of electrodes disposed opposite to each other, there arises a problem that uniform plasma cannot be generated over the entire electrode.

The present invention has been achieved in view of the above-described problem, and provides a plasma generating electrode and a plasma generation device capable of generating uniform and stable plasma at low power consumption. The invention also provides an exhaust gas purifying device which includes the above plasma generation device and a catalyst and can reliably purify exhaust gas.

In order to achieve the above objects, the invention provides the following plasma generating electrode, plasma generation device, and exhaust gas purifying device.

[1] A plasma generating electrode comprising at least a pair of electrodes disposed opposite to each other and generating plasma upon application of voltage between the pair of electrodes, at least one of the pair of electrodes including a plate-like ceramic body as a dielectric and a conductive film disposed inside the ceramic plate and having a plurality of through-holes formed through the conductive film in its thickness direction, the through-holes having a cross-sectional shape including an arc shape along a plane perpendicular to the thickness direction (hereinafter may be called "first invention").

[2] The plasma generating electrode according to [1], wherein the through-holes have a circular cross-sectional shape along a plane perpendicular to the thickness direction.

[3] The plasma generating electrode according to [1] or [2], wherein the through-holes are regularly arranged in the conductive film.

[4] The plasma generating electrode according to any of [1] to [3], wherein the conductive film is disposed inside the ceramic formed body by screen printing, calender rolling, spraying, chemical vapor deposition, or physical vapor deposition.

[5] The plasma generating electrode according to any of [1] to [4], wherein the through-holes have a diameter of 1 to 10 mm.

[6] The plasma generating electrode according to any of [1] to [5], wherein a center-to-center distance between the adjacent through-holes is 1.5 to 20 mm.

[7] The plasma generating electrode according to any of [1] to [6], wherein the conductive film includes at least one metal selected from the group consisting of tungsten, molybdenum, manganese, chromium, titanium, zirconium, nickel, iron, silver, copper, platinum, and palladium as a major component.

[8] A plasma generation device comprising the plasma generating electrode according to any of [1] to [7] (hereinafter may be called "second invention").

[9] An exhaust gas purifying device comprising the plasma generation device according to [8] and a catalyst, the plasma generation device and the catalyst being disposed inside an exhaust system of an internal combustion engine (hereinafter may be called "third invention").

BRIEF DESCRIPTION OF THE DRAWINGS

[FIG. 1]

[FIG. 2]

[FIG. 3]

[FIG. 4]

[FIG. 5(a)]

[FIG. 5(b)]

[FIG. 6]

BEST MODE FOR CARRYING OUT THE INVENTION

Embodiments of a plasma generating electrode, a plasma generation device, and an exhaust gas purifying device according to the present invention are described below in detail with reference to the drawings.

Figure 1:
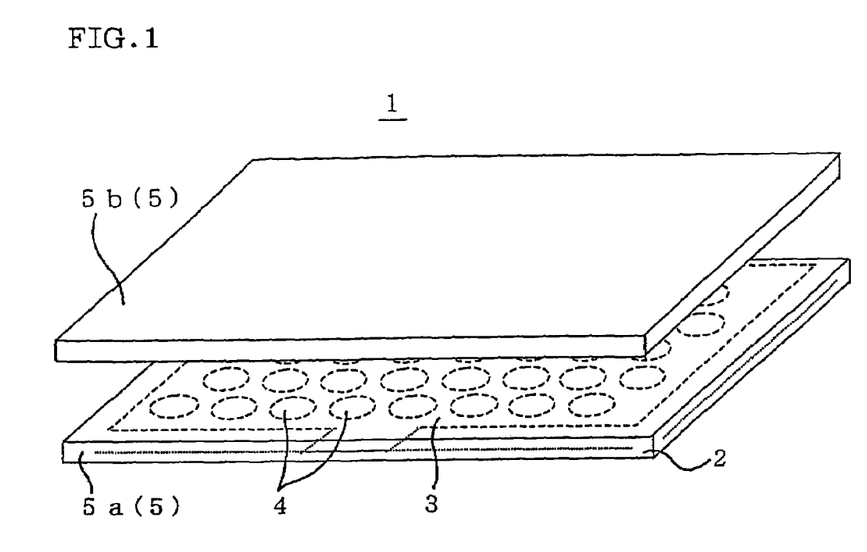
FIG. 1 is a perspective view schematically showing one embodiment of a plasma generating electrode according to the present invention (first invention).
Figure 2:
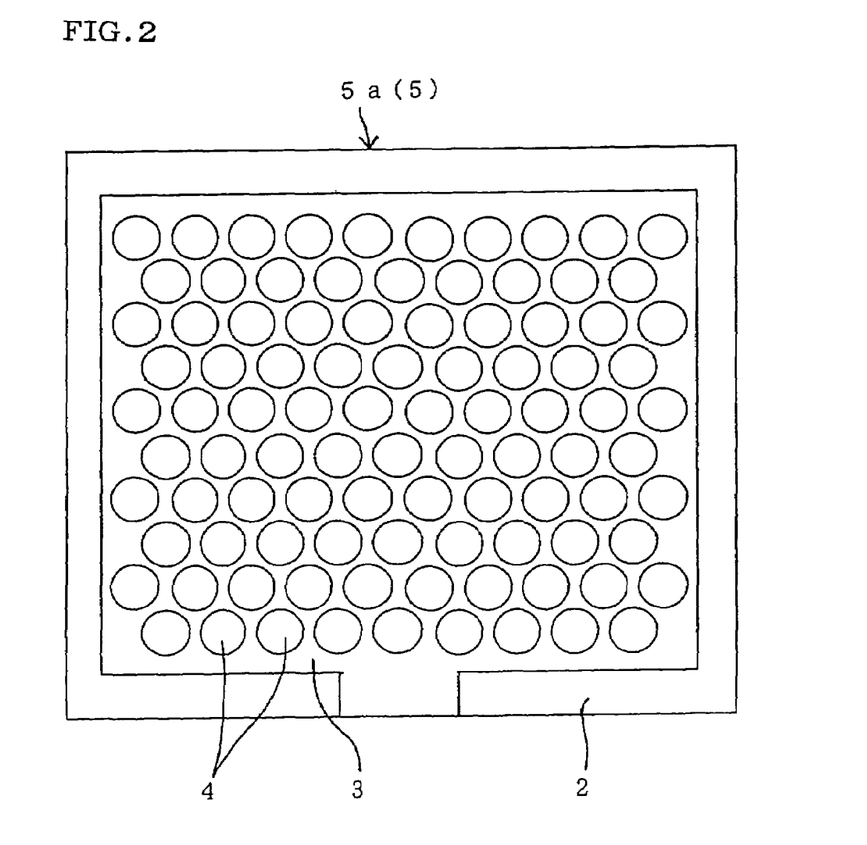
FIG. 2 is a plan view schematically showing an example of a ceramic formed body and a conductive film constituting an electrode in one embodiment of a plasma generating electrode according to the present invention (first invention).
Figure 3:
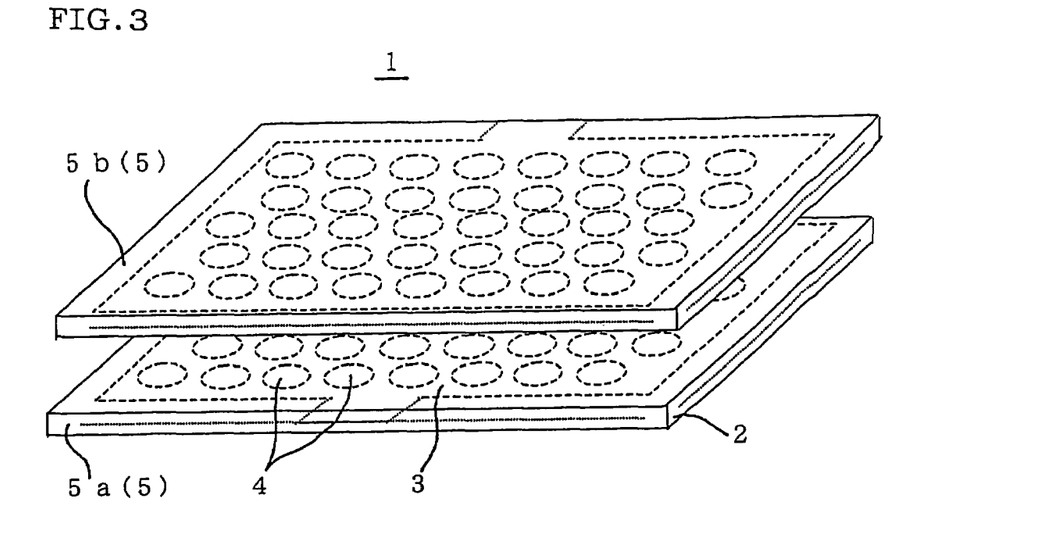
FIG. 3 is a perspective view schematically showing another embodiment of a plasma generating electrode according to the invention (first invention).

FIG. 1 is a perspective view schematically showing one embodiment of a plasma generating electrode according to the present invention (first invention), and FIG. 2 is a plan view schematically showing a ceramic body and a conductive film constituting one electrode of a plasma generating electrode. As shown in FIGS. 1 and 2, a plasma generating electrode 1 according to the present embodiment includes at least a pair of electrodes 5 disposed opposite to each other and generates plasma upon application of voltage between the electrodes 5, at least one electrode 5*a* of the pair of electrodes 5 including a plate-like ceramic body 2 as a dielectric and a conductive film 3 disposed inside the ceramic plate 2 and having a plurality of through-holes 4 formed through the conductive film 3 in its thickness direction, the through-holes having a cross-sectional shape including an arc shape along a plane perpendicular to the thickness direction (hereinafter may be called "cross-sectional shape of the through-hole"). In the present embodiment, the configuration of the other electrode is not particularly limited. As shown in FIG. 1, a conventionally known metal electrode may be used. As shown in FIG. 3, it is preferable that the other electrode 5*b* of the plasma generating electrode 1 include a conductive film having a plurality of through-holes formed through the conductive film in its thickness direction and having a cross-sectional shape including an arc shape along a plane perpendicular to the thickness direction. In this case, it is preferable that connection sections for respectively causing current to flow through the electrode 5*a* and the electrode 5*b* be formed in opposite directions.

In the plasma generating electrode 1 shown in FIG. 1, two electrodes 5 are disposed opposite to each other. However, the number of electrodes 5 is not limited to two. For example, three or more electrodes may be disposed in parallel so that adjacent electrodes respectively form a pair of electrodes (not shown).

FIGS. 1 and 2 illustrate the through-hole 4 having a circular cross-sectional shape along a plane perpendicular to the thickness direction. However, the cross-sectional shape of the through-hole 4 is not limited to circular, but may be an ellipse, a polygon having the vertices which are rounded off, or the like.

The plasma generating electrode 1 according to the present embodiment is a barrier discharge type plasma generating electrode 1 including the ceramic plate 2 as a dielectric and the conductive film 3 disposed inside the ceramic plate 2. The plasma generating electrode 1 may suitably be used for an exhaust gas treatment device or an exhaust gas purifying device which treats a treatment target fluid such as exhaust gas by causing the treatment target fluid to pass through plasma generated between a pair of electrodes 5, or an ozonizer which produces ozone by reacting oxygen contained in air, for example.

Conventionally, the barrier discharge type electrode has been considered to generate relatively uniform plasma due to occurrence of discharge over the entire surface of the dielectric. In practice, discharge does not occur in such a manner that the potential is equal over the entire surface of the dielectric. When the conductor (conductive film) is in the shape of a sheet, local point discharge occurs at unspecified points of the dielectric so that uniform plasma cannot be generated. When the conductor (conductive film) is in the shape of a mesh, discharge is concentrated at positions corresponding to the intersection points of the mesh so that uniform plasma cannot be generated. In the present embodiment, since the through-holes 4 having a cross-sectional shape including an arc shape along a plane perpendicular to the thickness direction of the conductive film 3 are formed in the conductive film 3 constituting the plasma generating electrode 1, the boundary between the through-hole 4 and the conductive film acts as a discharge starting point so that discharge can be uniformly caused to occur at the outer periphery of the through-hole 4. Moreover, since the through-holes 4 are formed in the entire conductive film, stable and uniform plasma can be generated between a pair of electrodes 5. If the cross-sectional shape of the through-hole 4 along a plane perpendicular to the thickness direction is polygonal or the like, a discharge is concentrated at positions corresponding to the vertices of the polygon or the like, so that uniform plasma cannot be generated.

The size of the through-hole 4 is not particularly limited. For example, it is preferable that the diameter of the through-hole 4 be 1 to 10 mm. This configuration allows electric field concentration at the outer periphery of the through-hole 4 to be appropriate for discharge, so that discharge occurs well even if the voltage applied between the pair of electrodes 5 is not so high. If the diameter of the through-hole 4 is less than 1 mm, discharge occurring at the outer periphery of the through-hole 4 becomes similar to the above-described local point discharge, so that nonuniform plasma may be generated. If the diameter of the through-hole 4 is more than 10 mm, since discharge hardly occurs inside the through-hole 4, the density of plasma generated between the pair of electrodes 5 may be decreased.

In the present embodiment, it is preferable that the center-to-center distance between the adjacent through-holes 4 be appropriately determined according to the diameters of the through-holes 4 so that uniform plasma can be generated at high density. For example, it is preferable that the center-to-center distance between the adjacent through-holes 4 be 1.5 to 20 mm, although the center-to-center distance is not limited thereto.

It is preferable that the through-hole 4 be formed so that the length of the outer periphery of the through-hole 4 per unit area is increased. This configuration enables length of the region in which a nonuniform electric field occurs, that is, the outer periphery acting as a plasma generation point, to be increased per unit area, so that a large amount of discharge per unit area is caused, whereby plasma can be generated at high density. A specific length of the outer periphery of the through-hole 4 per unit area ($mm/mm^2$) may appropriately be determined depending on the intensity of plasma to be generated or the like. In the case of treating automotive exhaust gas, the length of the outer periphery of the through-hole 4 per unit area is preferably 0.05 to 1.7 $mm/mm^2$. If the length of the outer periphery of the through-hole 4 per unit area is less than 0.05 $mm/mm^2$, local discharge may occur so that it may become difficult to obtain a stable discharge space. If the length of the outer periphery of the through-hole 4 per unit area is more than 1.7 $mm/mm^2$, the resistance of the conductive film may be increased, whereby discharge efficiency may be decreased.

In the present embodiment, it is preferable that the area of the conductive film 3 per unit area be 0.1 to 0.98 $mm^2/mm^2$. If the area of the conductive film 3 per unit area is less than 0.1 $mm^2/mm^2$, it may become difficult to cause discharge to occur in an amount necessary for purifying exhaust gas due to too small electrostatic capacitance of the dielectric electrode. If the area of the conductive film 3 per unit area is more than 0.98 $mm^2/mm^2$, it may be difficult to obtain a uniform discharge effect due to the through-holes, so that local discharge may easily occur.

In more detail, for determining the length of the outer periphery of the through-hole 4 and the area of the conductive film 3 per unit area, in the case of treating soot contained in automotive exhaust gas, it is preferable that the length of the outer periphery of the through-hole 4 per unit area be 1.0 $mm/mm^2$ or less and the area of the conductive film 3 per unit area be 0.2 $mm^2/mm^2$ or more. In the case of treating nitrogen oxide ($NO_x$) contained in exhaust gas, it is preferable that the length of the outer periphery of the through-hole 4 per unit area be 0.2 mm/mm$^2$ or more and the area of the conductive film 3 per unit area be 0.9 mm$^2$/mm$^2$ or less.

It is preferable that the conductive film 3 has a thickness corresponding to 0.1 to 10% of the thickness of the ceramic plate 2. This configuration allows uniform discharge to occur over the surface of the ceramic plate 2 as a dielectric. Specifically, it is preferable that the thickness of the conductive film 3 is about 5 to 50 µm in order to reduce the size of the plasma generating electrode 1 and reduce the resistance of a treatment target fluid, such as exhaust gas, which is caused to pass through the space between the pair of electrodes 5. If the thickness of the conductive film 3 is less than 5 µm, reliability may be decreased in the case of forming the conductive film 3 by printing or the like. Moreover, since the resistance of the resulting conductive film 3 may be increased, the plasma generation efficiency may be decreased. If the thickness of the conductive film 3 is more than 50 µm, the resistance of the conductive film 3 is reduced. However, since the conductive film 3 having such a thickness affects the uniformity of the surface of the ceramic plate 2, it may be necessary to process the surface of the ceramic plate 2 so that the surface becomes flat.

In the present embodiment, it is preferable that the conductive film 3 constituting the electrode 5a be disposed inside the ceramic plate 2 so that the conductive film 3 is positioned approximately at an equal distance from both the surfaces of the ceramic plate 2. This configuration enables plasma to be generated at an equal intensity between adjacent electrodes, even in the case of generating plasma in a state in which a plurality of electrodes are consecutively disposed opposite to one another. When the conductive film 3 is disposed so that the distances from both the surfaces of the ceramic plate 2 differ, the electrostatic capacitance differs between the surfaces of the electrode 5a, so that the discharge characteristics may differ between the surfaces.

The conductive film 3 used in the present embodiment preferably includes a metal exhibiting excellent conductivity as the major component. As suitable examples of the major component of the conductive film 3, at least one metal selected from the group consisting of tungsten, molybdenum, manganese, chromium, titanium, zirconium, nickel, iron, silver, copper, platinum, and palladium can be given. In the present embodiment, the term "major component" refers to a component accounting for 60 mass % or more of the components. When the conductive film 3 includes two or more metals selected from the above-mentioned group as the major component, the total amount of the metals accounts for 60 mass % or more of the components.

As a method of disposing the conductive film 3 inside the ceramic plate 2, a method of embedding the conductive film 3, such as a metal plate or metal foil, in a press-formed body obtained by powder press forming can be given, for example. In more detail, in the case of forming a press-formed body (ceramic body) by powder press forming, a metal plate or metal foil containing the above-mentioned metal as the major component is embedded so that the metal plate or metal foil is disposed at an equal distance (distance in the thickness direction) from the surfaces of the press-formed body. Since the embedded metal foil or the like may be deformed or cut due to firing shrinkage of the ceramics, it is preferable to sinter the press-formed body so that mass transfer is prevented in the horizontal (planar) direction. In this case, the press-formed body may be sintered while applying pressure to the press-formed body in the thickness direction.

The conductive film 3 may be applied to the ceramic plate 2. As suitable examples of the method of applying the conductive film 3, screen printing, calender rolling, chemical vapor deposition, and physical vapor deposition can be given.

According to these methods, a conductive film 3 exhibiting excellent surface flatness and smoothness after application and having a small thickness can be easily formed. Among the above application methods, chemical vapor deposition and physical vapor deposition may increase a cost. However, these methods enable a thinner conductive film to be easily disposed and through-holes having a smaller diameter and a smaller center-to-center distance to be easily formed.

In the case of applying the conductive film 3 to the ceramic plate 2, a powder of a metal mentioned above as the major component of the conductive film 3, an organic binder, and a solvent such as terpineol may be mixed together to form a conductive paste, and the conductive paste may be applied to the ceramic plate 2 by using the above-described method. An additive may optionally be added to the conductive paste in order to improve adhesion to the ceramic plate 2 and improve sinterability.

The adhesion between the conductive film 3 and the ceramic plate 2 can be improved by adding the same component as that of the ceramic plate 2 to the metal component of the conductive film 3. A glass component may be added to the ceramic component added to the metal component. The addition of the glass component improves the sinterability of the conductive film 3 so that the density of the conductive film 3 is improved in addition to adhesion. The total amount of the component of the ceramic plate 2 and/or the glass component other than the metal component is preferably 30 mass % or less. If the total amount exceeds 30 mass %, the function as the conductive film 3 may not obtained due to decrease in resistance.

The ceramic plate 2 in the present embodiment has the function as a dielectric as described above. By using the conductive film 3 in a state in which the conductive film 3 is held inside the ceramic plate 2, local discharge such as a spark can be reduced and small discharge can be caused to occur at a plurality of locations in comparison with the case of causing discharge to occur by using the conductive film 3 alone. Such small discharge can reduce power consumption, since the amount of current caused to flow is small in comparison with discharge such as a spark. Moreover, current which flows between the pair of electrodes 5 is limited due to the presence of the dielectric, so that nonthermal plasma consuming only a small amount of energy without increase in temperature can be generated.

The aforementioned ceramic body 2 preferably includes a material having a high dielectric constant as the major component. As the material for the ceramic plate 2, aluminum oxide, zirconium oxide, silicon oxide, titanium-barium type oxide, magnesium-calcium-titanium type oxide, barium-titanium-zinc type oxide, silicon nitride, aluminum nitride, or the like may be suitably used. The plasma generating electrode 1 can be operated at high temperature by using a material exhibiting excellent thermal shock resistance as the major component of the ceramic plate 2.

The thickness of the ceramic plate 2 is preferably 0.1 to 3 mm although the thickness is not limited thereto. If the thickness of the ceramic plate 2 is less than 0.1 mm, it may be difficult to ensure the electric insulating properties of the electrode 5. If the thickness of the ceramic plate 2 is more than 3 mm, reduction in size of an exhaust gas purifying system may be hindered. Moreover, the applied voltage must be increased due to increase in the electrode-to-electrode distance, whereby the efficiency may be decreased.

As the ceramic plate 2 used in the present embodiment, a ceramic green sheet used for a ceramic substrate may suitably be used. The ceramic green sheet may be obtained by forming slurry or paste for a green sheet to have a predetermined thickness by using a conventionally known method such as a doctor blade method, a calender method, a printing method, or a reverse roll coating method. The resulting ceramic green sheet may be subjected to cutting, shaving, punching, or formation of a communicating hole, or may be used as an integral laminate in which the green sheets are layered and bonded by thermocompression bonding or the like.

As the above slurry or paste for a green sheet, a mixture prepared by mixing an appropriate binder, sintering agent, plasticizer, dispersant, organic solvent, and the like into a predetermined ceramic powder may be suitably used. As suitable examples of the ceramic powder, alumina, mullite, ceramic glass, zirconia, cordierite, silicon nitride, aluminum nitride, glass, and the like can be given. As suitable examples of the sintering agent, silicon oxide, magnesium oxide, calcium oxide, titanium oxide, zirconium oxide, and the like can be given. The sintering agent is preferably added in an amount of 3 to 10 parts by mass with respect to 100 parts by mass of the ceramic powder. As the plasticizer, dispersant, and organic solvent, those used for a known method may suitably be used.

As the ceramic plate 2 used in the present embodiment, a ceramic sheet formed by extrusion may also be suitably used. For example, a plate-like ceramic formed body obtained by extruding by using a predetermined die a mixture prepared by mixing the above-mentioned ceramic powder with a forming agent such as methyl cellulose, a surfactant, and the like may be used.

In the present embodiment, the porosity of the ceramic formed body 2 is preferably 0.1 to 35%, and more preferably 0.1 to 10%. This configuration allows plasma to be efficiently generated between the electrode 5a including the ceramic plate 2 and the other electrode 5b disposed opposite to the electrode 5a, so that energy consumption can be reduced.

It is preferable that the pair of electrodes 5 be disposed at such a distance that plasma can be effectively generated therebetween. The electrodes 5 are preferably disposed at a distance of 0.1 to 5 mm although the distance may differ depending on the voltage applied to the electrodes or the like.

Figure 4:
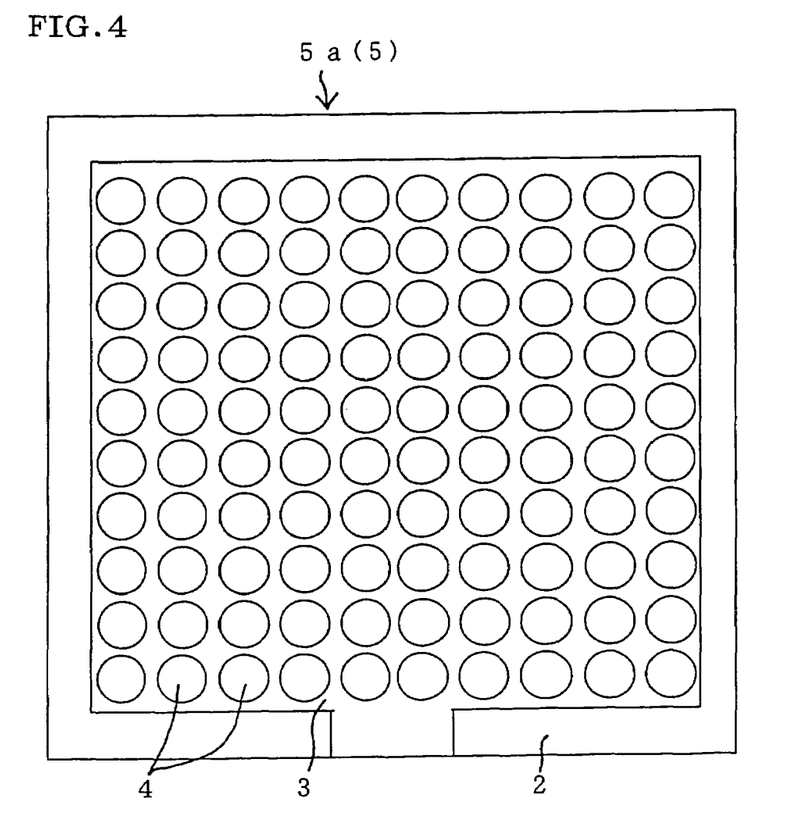
FIG. 4 is a plan view schematically showing another example of a ceramic formed body and a conductive film constituting the electrode in one embodiment of the plasma generating electrode according to the present invention (first invention).

In the electrode 5a shown in FIG. 2, the through-holes 4 are formed in the conductive film 3 so that the straight lines connecting the centers of the adjacent through-holes 4 form an equilateral triangle. However, the through-holes 4 may be formed so that the straight lines connecting the centers of the adjacent through-holes 4 form a square as shown in FIG. 4.

A method of manufacturing a plasma generating electrode of the present embodiment is described below in detail.

First, a ceramic green sheet used for the ceramic plate is formed. For example, a sintering agent, a binder such as a butyral resin or a cellulose resin, a plasticizer such as DOP or DBP, an organic solvent such as toluene or butadiene, and the like are added to at least one material selected from the group consisting of alumina, mullite, ceramic glass, zirconia, cordierite, silicon nitride, aluminum nitride, and glass. The components are sufficiently mixed by using an alumina pot and alumina ball to prepare slurry for a green sheet. The slurry for a green sheet may be prepared by mixing the materials by ball milling using a mono ball.

The resulting slurry for a green sheet is stirred under reduced pressure for degassing, and adjusted to have a predetermined viscosity. The resulting slurry for a green sheet is formed in the shape of a tape by using a tape forming method such as a doctor blade method to form an unfired ceramic body.

Meanwhile, a conductive paste for forming a conductive film disposed on one surface of the unfired ceramic body is provided. The conductive paste may be formed by adding a binder and a solvent such as terpineol to silver powder and sufficiently kneading the mixture by using a triroll mill, for example.

The resulting conductive paste is printed on the surface of the unfired ceramic body by screen printing or the like to form a conductive film having a predetermined shape. At that time, the conductive paste is printed so that through-holes having a circular cross-sectional shape are formed in the conductive film. In order to externally supply electricity to the conductive film after holding the conductive film inside the ceramic plate, the conductive paste is printed so that the conductive film extends to the outer periphery of the unfired ceramic body to secure an electricity supply section from the outside.

Another unfired ceramic formed-body is layered on the unfired ceramic body on which the conductive film is printed so that the printed conductive film is covered. It is preferable to layer the unfired ceramic formed bodies at a temperature of 100° C. while applying a pressure of 10 MPa.

Next, the unfired ceramic bodies layered with the conductive film interposed therebetween are fired to form an electrode including a plate-like ceramic body as a dielectric and a conductive film disposed inside the ceramic plate and having a plurality of through-holes formed through the conductive film in its thickness direction and having a cross-sectional shape including an arc shape along a plane perpendicular to the thickness direction.

A counter electrode is disposed opposite to the resulting electrode to form a plasma generating electrode of the present embodiment. As the counter electrode, an electrode obtained by using the above-described manufacturing method or an electrode having a conventionally known configuration may be used.

Figure 5A:
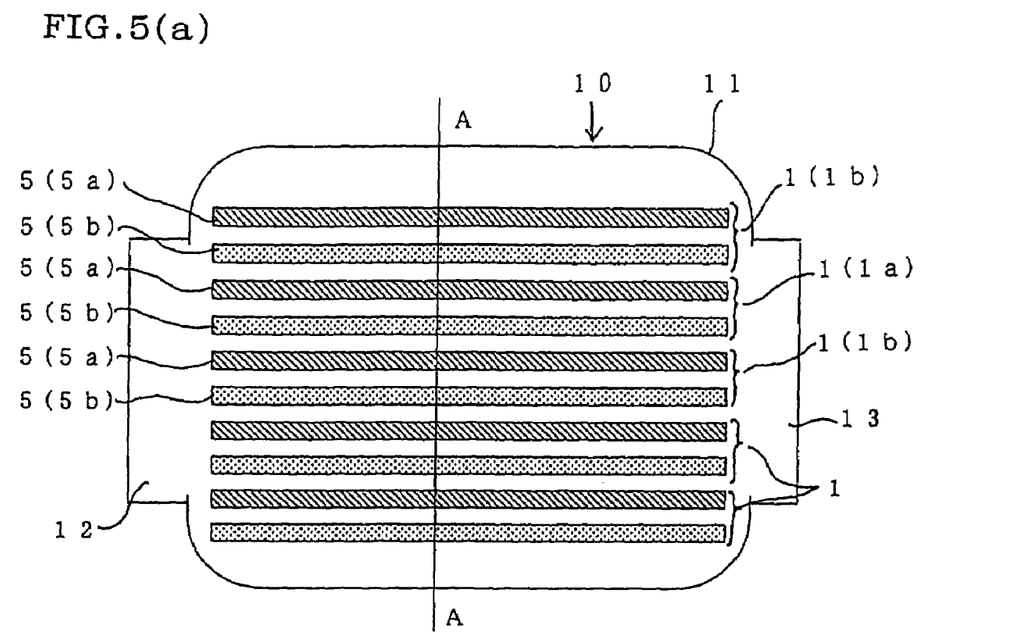
FIG. 5(a) is a cross-sectional view showing one embodiment of a plasma generation device according to the present invention (second invention) along a plane including the treatment target fluid flow direction.
Figure 5B:
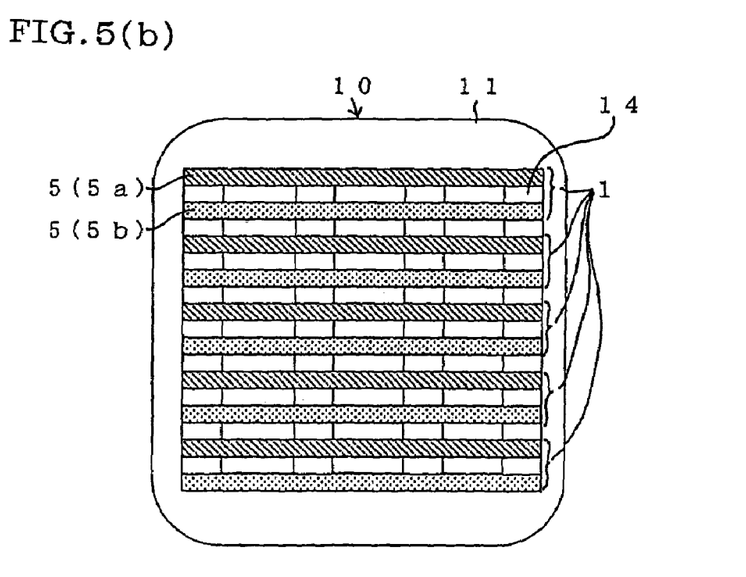
FIG. 5(b) is a cross-sectional diagram along the line A-A shown in FIG. 5(a).

One embodiment of a plasma generation device of the present invention (second invention) is described below. As shown in FIGS. 5(a) and 5(b), a plasma generation device 10 of the present embodiment includes the plasma generating electrode 1 of the first invention. In more detail, the plasma generation device 10 includes the plasma generating electrode 1 and a casing 11 which accommodates the plasma generating electrode 1 in a state in which a treatment target fluid such as exhaust gas can pass through the space between the pair of electrodes 5 constituting the plasma generating electrode 1. The casing includes an inlet port 12 through which the treatment target fluid flows in, and an outlet port 13 through which the treatment target fluid which has passed through the space between the electrodes 5 and has been treated (treated fluid) is discharged.

Since the plasma generation device 10 of the embodiment includes the plasma generating electrode 1 of the first invention, the plasma generation device 10 can generate uniform and stable plasma at low power consumption.

As shown in FIGS. 5(a) and 5(b), it is preferable in the plasma generation device 10 according to the embodiment that the plasma generating electrodes 1, each having a pair of electrodes 5, be disposed in layers inside the casing 11. FIGS. 5(a) and 5(b) illustrate the state in which five plasma generating electrodes 1, each having a pair of electrodes 5, are layered for convenience of illustration. However, the number of plasma generating electrodes 1 to be layered is not limited to thereto. A spacer 14 is disposed between the pair of electrodes 5 forming the plasma generating electrode 1 and between each of the plasma generating electrodes 1 in order to form a predetermined opening.

The plasma generation device 10 configured as described above may be installed in an automotive exhaust system, for example. In this case, exhaust gas discharged from an engine or the like is caused to pass through plasma generated between the pair of electrodes 5 so that toxic substances such as soot and nitrogen oxide contained in the exhaust gas are reacted and discharged to the outside as a nonhazardous gas.

It is preferable to layer the plasma generating electrodes 1 so that plasma can be generated between the layered plasma generating electrodes 1. Specifically, it is preferable to configure the plasma generation device 10 so that discharge occurs between the electrode 5a of the electrode 5 constituting the plasma generating electrode 1a and the electrode 5b disposed opposite to the electrode 5a and that discharge also occurs between the electrode 5a constituting the electrode 5 of the plasma generating electrode 1a and the electrode 5b constituting the adjacent plasma generating electrode 1b, such that plasma can be generated between the layered plasma generating electrodes 1.

The plasma generation device of the present embodiment may include a power source for applying voltage to the plasma generating electrode (not shown). As the power source, a conventionally known power source may be used insofar as the power supply can supply current which can effectively generate plasma. For example, a pulse power source using a thyristor, a pulse power source using a transistor other than a thyristor, a general AC power source, or the like may suitably be used.

The plasma generation device of the present embodiment may be configured so that current is supplied from an external power source instead of providing a power source inside the plasma generation device.

Current supplied to the plasma generating electrode used in the preesnt embodiment may appropriately be selected depending on the intensity of plasma to be generated. For example, in the case of installing the plasma generation device in an automotive exhaust system, it is preferable that current supplied to the plasma generating electrode be a direct current at a voltage of 1 kV or more, a pulsed current having a peak voltage of 1 kV or more and a pulse rate per second of 100 or more (100 Hz or more), an alternating current having a peak voltage of 1 kV or more and a pulse rate per second of 100 Hz or more, or a current generated by superimposing two of these currents. This enables efficient generation of plasma.

Figure 6:
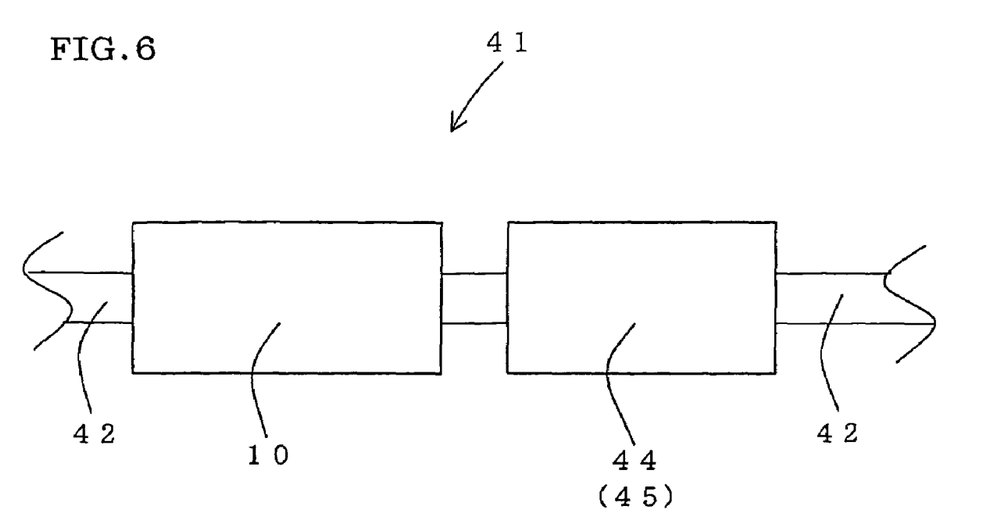
FIG. 6 is an explanatory view schematically showing one embodiment of an exhaust gas purifying device according to the present invention (third invention).

One embodiment of an exhaust gas purifying device of the present invention (third invention) is described below in detail. FIG. 6 is an explanatory view schematically showing an exhaust gas purifying device according to the embodiment. As shown in FIG. 6, an exhaust gas purifying device 41 of the present embodiment includes the plasma generation device 10 according to the above-described embodiment of the second invention and a catalyst 44, the plasma generation device 10 and the catalyst 44 being provided inside an exhaust system of an internal combustion engine. The plasma generation device 10 is provided on the exhaust gas generation side (upstream) of the exhaust system, and the catalyst 44 is provided on the exhaust side (downstream). The plasma generation device 10 and the catalyst 44 are connected through a pipe 42.

The exhaust gas purifying device 41 of the present embodiment is a device which purifies $NO_x$ in exhaust gas in an oxygen-excess atmosphere, for example. That is, $NO_x$ is reformed by plasma generated by the plasma generation device so that $NO_x$ is easily purified by the downstream catalyst 44, or a hydrocarbon (HC) or the like in exhaust gas is converted so that HC easily reacts with $NO_x$, to purify $NO_x$ by the catalyst 44.

The plasma generation device 10 used in the exhaust gas purifying device 41 of the present embodiment converts $NO_x$ in exhaust gas generated by combustion in an oxygen-excess atmosphere as in a lean burn or gasoline direct injection engine, a diesel engine, or the like into $NO_2$. The plasma generation device 10 generates active species from HC or the like contained in exhaust gas. As the plasma generation device 10, a plasma generation device configured in the same manner as the plasma generation device 10 shown in FIG. 5(a) may suitably be used.

The catalyst 44 is provided downstream of the plasma generation device 10 in the exhaust system as a catalyst unit 45 provided with a catalytic member including a substrate having pores through which exhaust gas circulates formed therein. The catalytic member includes the substrate and a catalyst layer formed to cover the inner walls surrounding the pores of the substrate.

The catalyst layer is generally formed by inpregnating the substrate with a catalyst in the form of slurry (catalyst slurry) as described later. Therefore, the catalyst layer may be called a "washcoat (layer)".

The shape of the substrate is not particularly limited insofar as the substrate has an exhaust gas circulation space. The present embodiment uses a honeycomb-shaped substrate in which pores are formed.

It is preferable that the substrate be formed of a material exhibiting heat resistance. As examples of such a material, a porous material (ceramic) such as cordierite, mullite, silicon carbide (SiC), and silicon nitride ($Si_3N_4$), a metal (e.g. stainless steel) and the like can be given.

The catalyst layer mainly includes a porous carrier and one or a combination of two or more elements selected from Pt, Pd, Rh, Au, Ag, Cu, Fe, Ni, Ir, and G a supported on the surface of the porous carrier. A plurality of pores communicating with the pores in the substrate are formed in the catalyst layer.

The porous substrate may appropriately be formed of alumina, zeolite, silica, titania, zirconia, silica-alumina, ceria, or the like. As the catalyst 44, a catalyst which promotes decomposition of $NO_x$ is used.

The invention is described below in detail by way of examples. However, the invention should not be construed as being limited to the following examples.

EXAMPLE 1

A plasma generation device including the plasma generating electrode 1 as shown in FIG. 1 was manufactured. The plasma generating electrode was manufactured by disposing two electrodes opposite to each other at a distance of 1 mm, each of the electrodes including a plate-like ceramic body as a dielectric formed of an alumina tape, and a conductive film disposed inside the ceramic plate and having through-holes formed through the conductive film in its thickness direction and having a circular cross-sectional shape along a plane perpendicular to the thickness direction. One of the pair of electrodes of the plasma generating electrode was used as a voltage application side, and the other was used as a grounding side.

The ceramic plate had a length of 50 mm, a width of 90 mm, and a thickness of 1 mm. The conductive film had a length of 40 mm, a width of 80 mm, and a thickness of 20 μm. The through-holes had a diameter of 3 mm and were equally formed so that the center-to-center distance was 5 mm. The conductive film was formed by printing a metal paste containing 95 mass % of tungsten on the surface of the ceramic plate and firing the metal paste together with the ceramic plate.

Five plasma generating electrodes thus obtained were layered so that the voltage application side and the grounding side of the pair of electrodes were alternately disposed to obtain a plasma generation device. The plasma generating electrodes were layered so that the distance between the plasma generating electrodes was 1 mm.

A pulse power source using a thyristor was connected with the voltage application side electrode of the plasma generating electrode, and the grounding side electrode was grounded.

The plasma generation device of the present example (Example 1) was electrified at a voltage of 5 kV and a frequency of 500 Hz. As a result, uniform and stable plasma could be generated.

A mixed gas prepared by mixing NO gas into gas in which the ratio of $N_2$ and $O_2$ was adjusted to the same ratio as in air was caused to pass through plasma generated by the plasma generation device of the present example to evaluate the conversion efficiency of NO contained in the mixed gas into $NO_2$.

Specifically, NO was added to a gas stream (50 NL/min) at room temperature to prepare a mixed gas having an NO concentration of 200 ppm. The mixed gas was caused to pass through plasma generated by using the plasma generation device of the present example. The plasma was generated at a voltage of 6 kV and a frequency of 500 Hz.

The NO concentration of the mixed gas after being passed through plasma was reduced to 85 ppm. The mixed gas having an NO concentration of 200 ppm was caused to pass through plasma generated at a voltage of 7 kV (power consumption: 25 W). As a result, the NO concentration was reduced to 2 ppm indicating that almost the total amount of NO was converted into $NO_2$. It is difficult to convert NO contained in exhaust gas into $N_2$ and $O_2$ by using an exhaust gas treatment catalyst at low temperature around room temperature. However, the purification of NO is facilitated by converting NO into $NO_2$ through plasma, so that clean gas can be easily obtained.

COMPARATIVE EXAMPLE 1

A plasma generation device was manufactured in the same manner as the plasma generation device of Example 1 except that the through-holes were not formed.

The plasma generation device was electrified at a voltage of 7 kV and a frequency of 500 Hz by using a pulse power source using a thyristor, and a mixed gas having an NO concentration of 200 ppm was caused to pass through plasma in the same manner as in Example 1. As a result, the NO concentration was reduced to only 50 ppm. In Comparative Example 1, discharge occurred at arbitrary locations on the surface of the electrode when plasma was generated. Therefore, since discharge did not occur in the entire space, non-uniform plasma was generated. Though discharge occurred in the entire space by injecting high energy by increasing the voltage to 8 kV, high voltage and high power was necessary in comparison with the electrode having the through-holes.

EXAMPLE 2

A plasma generation device was manufactured in the same manner as the plasma generation device of Example 1 except for disposing circular through-holes having a diameter of 5 mm at a center-to-center distance of 6 mm.

When causing a mixed gas similar to that described above to pass through the plasma generation device of the present example (Example 2), the NO concentration was reduced to 3 ppm at a power consumption of 18 W. This plasma generation device could convert NO at low power consumption in comparison with the plasma generation device of Example 1 so that high energy efficiency was obtained. This indicates that the diameter and the center-to-center distance of the through-holes affect power required to generate plasma.

EXAMPLE 3

A plasma generation device was manufactured in the same manner as the plasma generation device of Example 1 except for using a stainless steel electrode as one of the pair of electrodes constituting the plasma generating electrode.

The same mixed gas was caused to pass through the plasma generation device of the present example (Example 3). Electrification was performed at a voltage of 6 kV and a frequency of 500 Hz, and a mixed gas having an NO concentration of 200 ppm was caused to pass through plasma generated. As a result, the NO concentration was reduced to 5 ppm. At this time, the amount of power supplied to the plasma generation device was 40 W, so that power consumption was higher than that of Example 1. However, NO could be converted with high efficiency.

EXAMPLE 4

An AC power source was connected with a plasma generation device manufactured in the same manner as the plasma generation device of Example 1, and an NO conversion efficiency test was conducted. In the case of generating plasma by supplying electricity at a voltage of ±7 kV and a frequency of 500 Hz (sine wave), the NO concentration was reduced to 100 ppm. By supplying electricity at a voltage of ±7 kV and a frequency of 1 kHz (sine wave), the NO concentration was reduced to 10 ppm. Thus, plasma could effectively be generated also by using the AC power source.

EXAMPLE 5

A plasma generation device was manufactured in the same manner as the plasma generation device of Example 1 except for changing the electrode-to-electrode distance to 0.5 mm.

In order to evaluate the exhaust gas carbon particulate purification performance, soot was caused to flow through the plasma generation device at a flow rate of 5 g/hr, and the amount of carbon particulate trapped at the discharge port of the plasma generation device was evaluated.

Plasma was generated by supplying electricity at a voltage of 5 kV and a frequency 250 Hz by using a pulse power source using an SI thyristor, and the purification rate calculated from the amount of carbon particulate trapped was 60%. In the case of supplying electricity at a voltage of 5 kV and a frequency of 500 Hz, the carbon particulate purification rate was increased to 90%. Therefore, it was confirmed that the plasma generation device of the present example (Example 5) is effective for removing carbon particulate.

EXAMPLE 6

An exhaust gas purifying device was manufactured by disposing a catalyst downstream of the plasma generation device of Example 1. The $NO_x$ purification performance of the exhaust gas purifying device was evaluated. As the catalyst, a catalyst powder prepared by impregnating commercially-available $\gamma$-$Al_2O_3$ with 5 mass % of Pt was supported on a cordierite ceramic honeycomb. The honeycomb catalyst was in the shape of a cylinder having a diameter of 1 in (about 2.54 cm) and a length of 60 mm. The number of cells was 400, and the thickness (rib thickness) of the partition walls partitioning the cells was 4 mil (about 0.1 mm). The plasma generation conditions and the gas conditions were the same as those of Example 1 (7 kV).

As a result, the $NO_x$ concentration of the mixed gas having an NO concentration of 200 ppm was reduced to 80 ppm after the mixed gas had passed the plasma generation device and the catalyst.

COMPARATIVE EXAMPLE 2

An exhaust gas purifying device was manufactured by disposing a catalyst similar to that used in Example 6 downstream of the plasma generation device of Comparative Example 1. The $NO_x$ purification performance of the exhaust gas purifying device was evaluated. The plasma generation conditions and the gas conditions were the same as those of Comparative Example 1.

As a result, the $NO_x$ concentration of the mixed gas having an NO concentration of 200 ppm was reduced little to 110 ppm after the mixed gas had passed the plasma generation device and the catalyst.

INDUSTRIAL APPLICABILITY

A plasma generating electrode and a plasma generation device of the present invention can generate uniform and stable plasma at low power consumption. Since an exhaust gas purifying device of the present invention includes the aforementioned plasma generation device and a catalyst, the exhaust gas purifying device can suitably be used as a purifying device which purifies, for example, exhaust gas discharged from an automotive engine or the like.

The invention claimed is:

1. A plasma generating electrode comprising at least a pair of electrodes disposed opposite to each other and generating plasma upon application of voltage between the pair of electrodes, at least one of the pair of electrodes including a ceramic plate having two major surfaces as a dielectric and a conductive film disposed inside the ceramic plate sandwiched between the two major surfaces and having a plurality of through-holes formed through the conductive film in its thickness direction, the through-holes having a cross-sectional shape including an arc shape along a plane perpendicular to the thickness direction, wherein a cross-sectional area of the through-holes have a diameter of 1 to 10mm.

2. The plasma generating electrode according to claim 1, wherein the through-holes have a circular cross-sectional shape along the plane perpendicular to the thickness direction.

3. The plasma generating electrode according to claim 1, wherein the through-holes are regularly arranged in the conductive film.

4. The plasma generating electrode according to claim 1, wherein the conductive film is disposed inside the ceramic plate by screen printing, calender rolling, spraying, chemical vapor deposition, or physical vapor deposition.

5. The plasma generating electrode according to claim 1, wherein a center-to-center distance between the adjacent through-holes is 1.5 to 20 mm.

6. The plasma generating electrode according to claim 1, wherein the conductive film includes at least one metal selected from the group consisting of tungsten, molybdenum, manganese, chromium, titanium, zirconium, nickel, iron, silver, copper, platinum, and palladium as a major component.

7. A plasma generation device comprising the plasma generating electrode according to claim 1.

8. An exhaust gas purifying device comprising the plasma generation device according to claim 7 and a catalyst, the plasma generation device and the catalyst being disposed inside an exhaust system of an internal combustion engine.

* * * * *

UNITED STATES PATENT AND TRADEMARK OFFICE
CERTIFICATE OF CORRECTION

PATENT NO. : 7,635,824 B2  Page 1 of 1
APPLICATION NO. : 10/560805
DATED : December 22, 2009
INVENTOR(S) : Masanobu Miki et al.

It is certified that error appears in the above-identified patent and that said Letters Patent is hereby corrected as shown below:

On the Title Page, please delete the following:

Item "(73)    Assignees:    NGK Insulators, Ltd., Nagoyo (JP);
                            Honda Motor Co., Ltd., Tokyo (JP)"

And Replace with:

Item --(73)   Assignees:    NGK Insulators, Ltd., Nagoya (JP);
                            Honda Motor Co., Ltd., Tokyo (JP)--

Signed and Sealed this

Twenty-third Day of February, 2010

David J. Kappos
*Director of the United States Patent and Trademark Office*